US007965553B2

(12) United States Patent
Han

(10) Patent No.: US 7,965,553 B2
(45) Date of Patent: Jun. 21, 2011

(54) METHOD OF VERIFYING A PROGRAM OPERATION IN A NON-VOLATILE MEMORY DEVICE

(75) Inventor: Jung Chul Han, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 99 days.

(21) Appl. No.: 12/469,346

(22) Filed: May 20, 2009

(65) Prior Publication Data

US 2009/0290418 A1 Nov. 26, 2009

(30) Foreign Application Priority Data

May 20, 2008 (KR) .................. 10-2008-0046615

(51) Int. Cl.
*G11C 5/14* (2006.01)
(52) U.S. Cl. .......... 365/185.09; 365/185.22; 365/185.12
(58) Field of Classification Search ............ 365/185.09, 365/185.22, 185.12
See application file for complete search history.

(56) References Cited

U.S. PATENT DOCUMENTS

| 7,317,636 B2* | 1/2008 | Ide et al. ............ 365/185.22 |
| 2007/0183199 A1* | 8/2007 | Chung .................. 365/185.08 |

FOREIGN PATENT DOCUMENTS

KR  1020060092329  8/2006

* cited by examiner

*Primary Examiner* — Huan Hoang
(74) *Attorney, Agent, or Firm* — IP & T Group LLP

(57) ABSTRACT

A method of verifying a program operation in a non-volatile memory device includes performing a program operation, verifying whether or not each of a plurality of program target memory cells is programmed to a voltage higher than a verifying voltage, counting a number of fail status bits in response to determining that a fail status memory cell is not programmed with a voltage higher than the verifying voltage based on the verified result, and setting data so that a plurality of page buffers each output a pass signal when the number of the fail status bits is smaller than a number of error correction code (ECC) processing bits.

16 Claims, 9 Drawing Sheets

FIG. 4

SLC

0 : program target
1 : erase target or program completion

|  | normal memory cell | memory cell having slow program speed |
|---|---|---|
| 1st pulse & verification | 10 | 10 |
| Nth pulse & verification | 11 | 10 |
| (N+m) pulse & verification | 11 | 11 |

→ completion of a program operation of normal memory cells

→ completion of a program operation of every memory cell

MLC having two bits

|  | normal memory cell | memory cell having slow program speed |
|---|---|---|
| 1st pulse & verification | 1000 | 1000 |
| N1th pulse & verification | 1100 | 1000 |
| (N1+m1) pulse & verification | 1100 | 1100 |
| N2th pulse & verification | 1110 | 1100 |
| (N2+m2) pulse & verification | 1110 | 1110 |
| N3th pulse & verification | 1111 | 1110 |
| (N3+m3) pulse & verification | 1111 | 1111 |

→ completion of a first verifying operation on normal memory cells

→ completion of a first verifying operation on every memory cell

→ completion of a second verifying operation on normal memory cells

→ completion of a second verifying operation on every memory cell

→ completion of a third verifying operation on normal memory cells

→ completion of a third verifying operation on every memory cell

FIG. 5

SLC

0 : program target
1 : erase target or program completion

| | normal memory cell | memory cell having slow program speed | |
|---|---|---|---|
| 1st pulse & verification | 10 | 10 | |
| Nth pulse & verification | 11 | 10 | ← completion of a program operation of normal memory cells |
| setting data for the memory cell having slow program speed | 11 | 11 | ← completion of a program operation of every memory cell |

MLC having two bits

| | normal memory cell | memory cell having slow program speed | |
|---|---|---|---|
| 1st pulse & verification | 1000 | 1000 | |
| N1th pulse & verification | 1100 | 1000 | |
| setting data for the memory cell having slow program speed | 1100 | 1100 | ← completion of a first verifying operation |
| N2th pulse & verification | 1110 | 1100 | |
| setting data for the memory cell having slow program speed | 1110 | 1110 | ← completion of a second verifying operation |
| N3th pulse & verification | 1111 | 1110 | |
| setting data for the memory cell having slow program speed | 1111 | 1111 | ← completion of a third verifying operation |

METHOD OF VERIFYING A PROGRAM OPERATION IN A NON-VOLATILE MEMORY DEVICE

CROSS-REFERENCE TO RELATED APPLICATIONS

This application claims priority from Korean Patent Application No. 10-2008-0046615, filed on May 20, 2008, the contents of which are incorporated herein by reference in its entirety.

BACKGROUND OF THE INVENTION

The present invention relates to a method of verifying a program operation in a non-volatile memory device.

Recently, the demand has increased for a non-volatile memory device which electrically programs and erases data, and does not require a refresh function of periodically rewriting data.

The non-volatile memory device performs a program operation and an erase operation by changing a threshold voltage of a memory cell through moving of electrons by high electric field applied to a thin oxide film.

The non-volatile memory device includes generally a memory cell array, in which memory cells for storing data are disposed in matrix shape, and a page buffer for programming data in a specific memory cell of the memory cell array or reading data from a certain memory cell.

The page buffer has a pair of bit lines connected to a corresponding memory cell, a register for storing temporarily data to be programmed in the memory cell array or data read from a given memory cell, a sensing node for sensing voltage level of a specific bit line or a certain register, and a bit line select circuit for controlling connection of the bit line and the sensing node.

The memory cell may store various different states, and thus a threshold voltage of the memory cell should be increased depending on the states through a program operation.

In case that the same program voltage is applied, the threshold voltage is theoretically increased by the same level. However, since the memory cells do not have uniform characteristics, a memory cell may be programmed more rapidly than the other memory cells or a memory cell may be programmed more slowly than the other memory cells.

In case of programming the memory cell in accordance with an incremental step pulse program (ISPP) method, a program pulse is continuously applied to a corresponding word line until every memory cell is programmed to a voltage more than desired threshold voltage. Hence, in case that a memory cell having a slow program speed exists, the time to be taken for the program operation may be increased. Accordingly, in case that a memory cell has a slow program speed, a time for the program operation should be reduced.

The above information disclosed in this related art section is only for enhancement of understanding of the background of the invention and therefore it may contain information that does not form the prior art that is already known in this country to a person of ordinary skill in the art.

SUMMARY OF THE INVENTION

It is a feature of the present invention to provide a method of verifying a program operation in a non-volatile memory device for setting data of a page buffer so that a memory cell having a slow program speed is compulsory programmed at a specific time point.

A method of verifying a program operation in a non-volatile memory device according to one exemplary embodiment of the present invention includes performing a program operation; verifying whether or not each of a plurality of program target memory cells is programmed to a voltage higher than a verifying voltage; counting a number of fail status bits in response to determining that a fail status memory cell is not programmed with a voltage higher than the verifying voltage based on the verified result; and setting data so that a plurality of page buffers each output a pass signal when the number of the fail status bits is smaller than a number of error correction code (ECC) processing bits.

A method of verifying a program operation in a non-volatile memory device according to another exemplary embodiment of the present invention includes performing a program operation; verifying whether or not each of a plurality of first program target memory cells is programmed to a voltage higher than a first verifying voltage; setting data so that a page buffer for the first program target memory cells outputs a first pass signal in accordance with a number of fail status bits in response to determining that a fail status memory cell is not programmed to a voltage higher than the first verifying voltage; verifying whether or not each of a plurality of second program target memory cells is programmed to a voltage higher than a second verifying voltage; setting data so that a page buffer for the second program target memory cells outputs a second pass signal in accordance with a number of fail status bits in response to determining that a fail status memory cell is not programmed to a voltage higher than the second verifying voltage; verifying whether or not each of a plurality of third program target memory cells is programmed to a voltage higher than a third verifying voltage; and setting data so that a page buffer for the third program target memory cells outputs a third pass signal in accordance with a number of fail status bits in response to determining that a fail memory cell is not programmed to a voltage higher than the third verifying voltage.

A method of verifying a program operation in a non-volatile memory device according to still another exemplary embodiment of the present invention includes performing a program operation on memory cells and sample cells; verifying whether or not each of a plurality of program target memory cells is programmed to a voltage higher than a verifying voltage; verifying whether or not each of a plurality of sample cells is programmed to a voltage higher than the verifying voltage in response to determining that a fail status target memory cell is not programmed to a voltage higher than the verifying voltage based on the verified result; and setting data so that a plurality of page buffers output a pass signal in response to determining that each of the plurality of sample cells is programmed to a voltage higher than the verifying voltage based on the verified result.

A method of verifying a program operation in a non-volatile memory device according to still another exemplary embodiment of the present invention includes performing a program operation on memory cells and sample cells; verifying whether or not each of first program target memory cells is programmed to a voltage higher than a first verifying voltage; setting data so that a page buffer for the first program target memory cells outputs a first pass signal in response to a fail status state of the sample cells in response to determining that a fail status cell is not programmed to a voltage higher than the first verifying voltage based on the verified result; verifying whether or not each of a plurality of second program target memory cells is programmed to a voltage higher than a second verifying voltage; setting data so that a page buffer for the second program target memory cells outputs a second pass signal based on a fail status of the sample cells in response to determining that a fail status cell is not programmed to a voltage higher than the second verifying voltage based on the verified result; verifying whether or not each of a plurality of third program target memory cells is programmed to a voltage higher than a third verifying voltage; and setting data so that a page buffer for the third program target memory cells outputs a third pass signal in response to a fail status of the sample cells in response to determining that a fail status cell is not programmed to a voltage higher than the third verifying voltage based on the verified result.

As described above, a method of verifying a program operation in a non-volatile memory device does not perform continuously the program operation until a memory cell having slow program speed is programmed to a voltage higher than a verifying voltage. However, the method does not perform additional program operation at a time point, at which number of fail status bits is smaller than that of ECC processing bits, after a given time point, or at a time point, at which every sample cell is programmed, after the specific time point. As a result, a time to be taken for the verifying operation may be reduced.

BRIEF DESCRIPTION OF THE DRAWINGS

The above and other features and advantages of the present invention will become readily apparent by reference to the following detailed description when considered in conjunction with the accompanying drawings wherein:

FIG. 4 is a view illustrating a table showing change of data in a page buffer in accordance with program speed when a verifying operation is performed in a conventional non-volatile memory device;

FIG. 5 is a view illustrating a table showing change of data in a page buffer in accordance with program speed when a verifying operation is performed in a non-volatile memory device according to one example embodiment of the present invention;

DESCRIPTION OF SPECIFIC EMBODIMENTS

Hereinafter, the preferred embodiments of the present invention will be explained in more detail with reference to the accompanying drawings.

Figure 1:
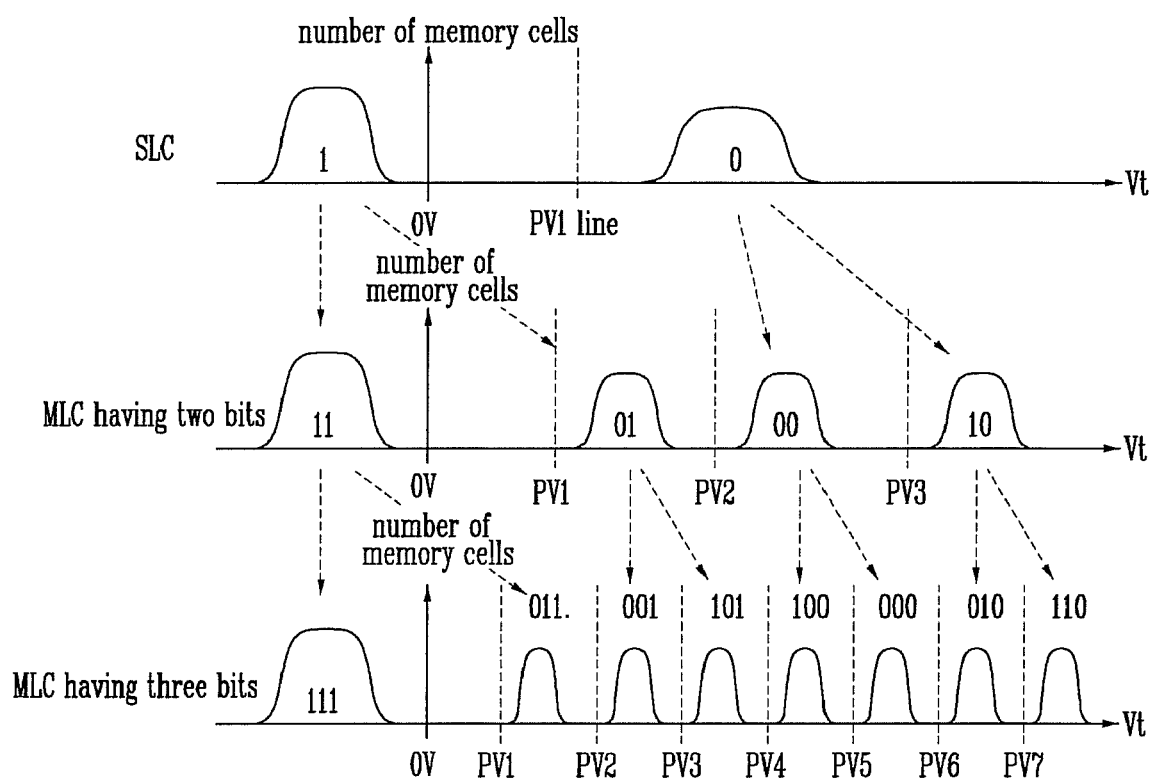
FIG. 1 is a view illustrating states of a memory cell in a conventional non-volatile memory device.

FIG. 1 is a view illustrating states of a memory cell in a conventional non-volatile memory device.

One memory cell may store at least two states. That is, a single level cell stores two states '1' and '0' corresponding to different threshold voltages in accordance with a program operation. In this case, a read operation is performed by using the difference between the threshold voltages.

In case of programming a multi level cell having two bits, one multi level cell may store four states '11', '01', '00' and '10' corresponding to different threshold voltages.

In case of programming a multi level cell having three bits, one multi level cell may store eight states '11', '011', '001', '101', '100', '000', '010' and '110' corresponding to different threshold voltages.

Namely, in case of programming a multi level cell having n bits, the multi level cell stores theoretically $2^n$ states corresponding to different threshold voltages. On the other hand, a binary number shown in FIG. 1 may be variously modified.

Since one memory cell stores various states as mentioned above, a threshold voltage of the memory cell should be differently increased in accordance with corresponding state when a program operation is performed. Here, the program operation means a process of increasing a threshold voltage of each memory cells to a desired threshold voltage.

In case that the same program voltage is applied, the threshold voltage is theoretically increased by the same level. However, since the memory cells do not have uniform characteristics, a memory cell may be programmed more rapidly than the other memory cells or a memory cell may be programmed more slowly than the other memory cells.

In case of programming the memory cell in accordance with an incremental step pulse program (ISPP) method, a program pulse is continuously applied to a corresponding word line until every memory cell is programmed to a voltage more than a desired threshold voltage. Hence, in case that the memory cell having slow program speed exists, a time for the program operation is increased. Hereinafter, this process will be described in detail with reference to accompanying drawings.

Figure 2:
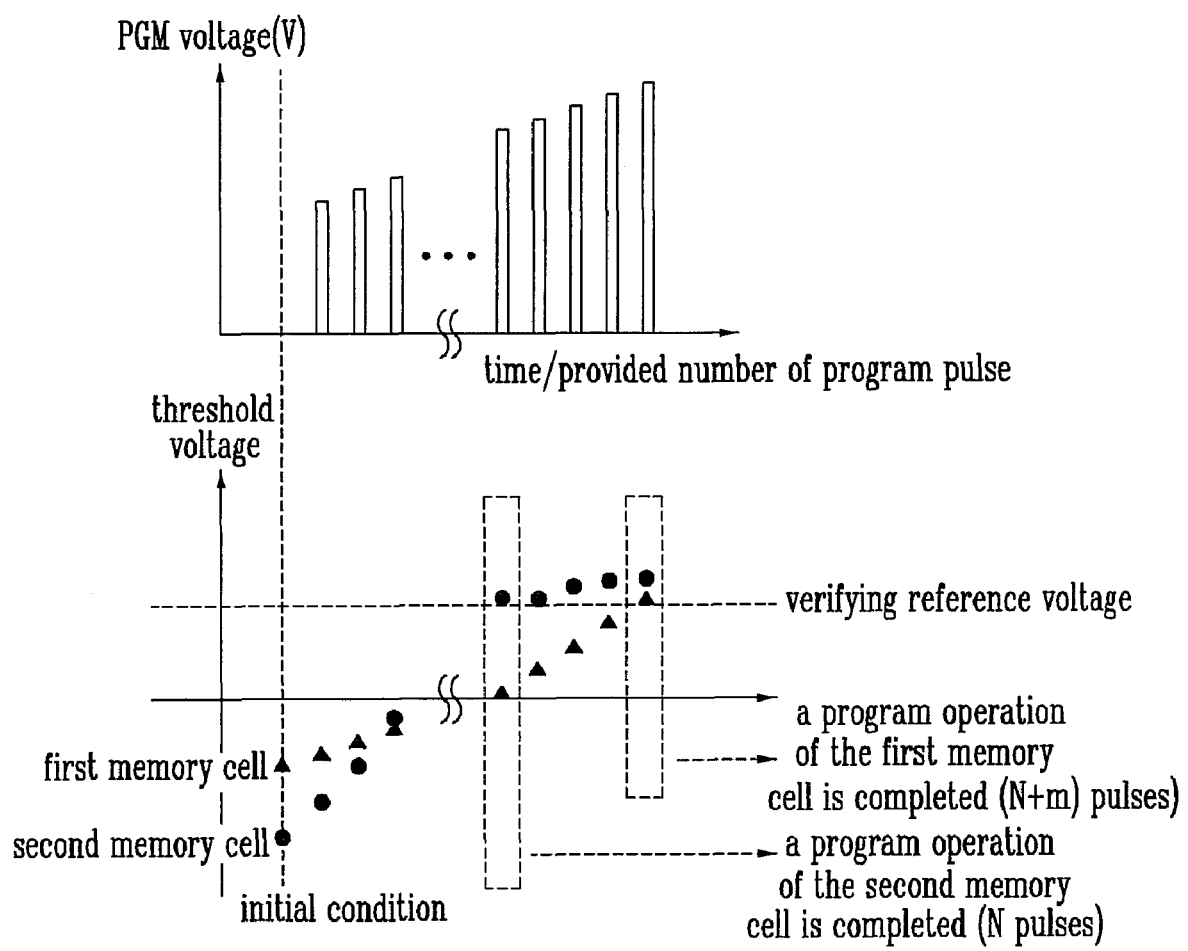
FIG. 2 is a view illustrating difference of program speed in a conventional non-volatile memory cell.

FIG. 2 is a view illustrating difference of program speed in a conventional non-volatile memory cell.

It is assumed that a threshold voltage of a first memory cell is higher than that of a second memory cell at an initial condition. However, the threshold voltage of the second memory cell is increased by a level greater than an increased level of the threshold voltage of the first memory cell when one program pulse is provided to a corresponding word line. That is, program speed of the second memory cell is faster than that of the first memory cell. In this case, the threshold voltage of the second memory cell is increased to a voltage more than a verifying reference voltage by providing a program pulse N times to corresponding word line, and thus a program operation for the second memory cell is finished. However, a program operation for the first memory cell having slow program speed is finished by providing the program pulse (N+m) times. In other words, since a memory cell having slow program speed exists, a time to be taken for whole program operations is increased.

Accordingly, according to an embodiment of the present invention, a memory cell having slow program speed may be programmed after specific time point, and a program operation is then finished.

Hereinafter, a page buffer of the present invention related to the program operation will be described in detail.

Figure 3:
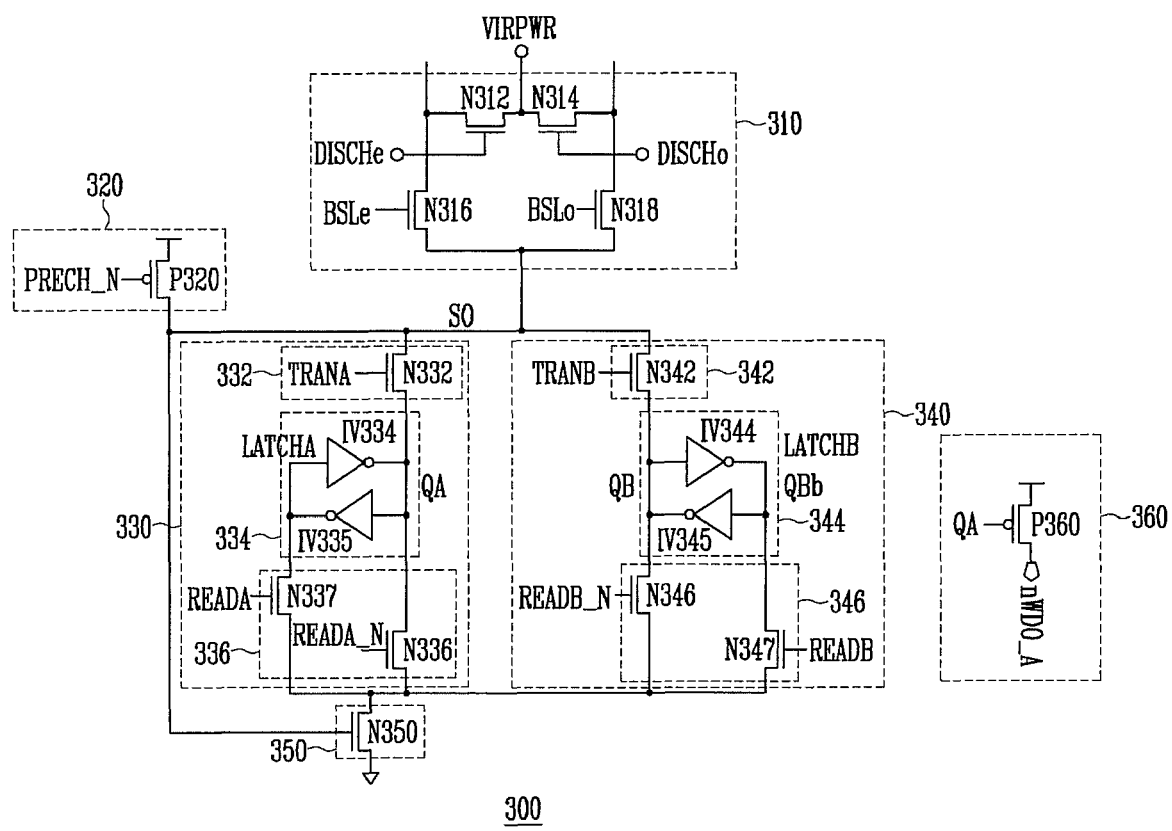
FIG. 3 is a view illustrating circuitry of a page buffer in a non-volatile memory device according to one example embodiment of the present invention.

FIG. 3 is a view illustrating circuitry of a page buffer in a non-volatile memory device according to one example embodiment of the present invention.

The page buffer 300 of the present embodiment includes a bit line selection circuit 310 for coupling selectively a bit line coupled to a specific memory cell to a sensing node, a sensing node precharging circuit 320 for applying a supply voltage having a high level to the sensing node, a first register 330 and a second register 340 for temporarily storing data to be programmed in a given memory cell or data read from specific memory cell, a ground voltage supplying circuit 350 for applying a ground voltage to the register 330 or 340 in accordance with level of the sensing node, and a verifying signal outputting circuit 360 for indicating whether or not a verifying operation is finished in accordance with data stored in the register 330 and 340.

Since a constitution of the page buffer 300 is well-known by persons skilled in the art, any further description concerning the constitution will be omitted. On the other hand, the page buffer 300 is provided as one example so as to describe a program operation and a verifying operation, and thus may be variously modified.

Hereinafter, operation of the page buffer 300 for the program operation and the verifying operation will be described in detail.

In the program operation, programming of a memory cell is determined in accordance with data stored in a first node QA of a latch 334 in the first register 330.

Generally, in case that data '1' having a high level is stored in the first node QA, a corresponding memory cell is to be erased. However, in case that data '0' having low a level is stored in the first node QA, a corresponding memory cell is to be programmed. The data is provided to a corresponding bit line through a data transmitting circuit 332 and a sensing node SO.

The program operation is performed in accordance with the data, and then a verifying operation, for verifying whether or not a threshold voltage of a program target memory cell is increased to a voltage more than a verifying reference voltage, is performed.

The sensing node SO is pre-charged to a high level when the verifying operation is performed. In case that a program of the program target memory cell is completed, the sensing node SO maintains a high level.

However, in case of an erase target memory cell or in case that the program target memory cell is not programmed to a voltage more than the verifying reference voltage, the sensing node SO is discharged to a low level.

Accordingly, it is verified on the basis of level of the voltage applied to the sensing node SO whether or not corresponding memory cell is programmed. Namely, in case that the program target memory cell is programmed to a voltage more than the reference voltage, the sensing node SO maintains a high level, and so the ground voltage supplying circuit 350 is driven. Here, in case that a first data setting signal READA_N is provided to a data setting circuit 336, data '1' having a high level is stored in the first node QA.

In case of the erase target memory cell, data '1' having a high level is stored in the first node QA at initial condition. In addition, the sensing node SO has a low level in accordance with the verifying result, and so the ground voltage supplying circuit 350 is not driven. As a result, data '1' having a high level is maintained in the first node QA.

In case that a memory cell, not programmed to a voltage more than the verifying reference voltage, of the program target memory cells exists, the sensing node SO has a low level. Hence, the ground voltage supplying circuit 350 is not driven, and so data '0' having a low level is maintained in the first node QA.

That is, the data '0' having a low level is stored in the first node QA only when the program target memory cell is not programmed.

The program operation is repeatedly performed until every data is changed into the data '1' having a high level.

On the other hand, it is verified through the verifying signal outputting circuit 360 whether or not the verifying operation is completed. Since an output terminal of the verifying signal outputting circuit 360 has floating state in case that the data having a high level is stored in the first node QA, it is verified through a state of the output terminal of the verifying signal outputting circuit 360 in every page buffer whether or not the verifying operation is completed.

In brief, it is verified through the data stored in a specific node of the latch in the page buffer whether or not corresponding memory cell is programmed. Additionally, the number of the memory cells not programmed of the program target memory cells, i.e., the number of failed memory cells may be verified by outputting the data stored in the specific node.

FIG. 4 is a view illustrating a table showing change of data in a page buffer in accordance with program speed when a verifying operation is performed in a conventional non-volatile memory device.

In case of a normal single level cell, every data stored in the latch is changed into a high level, i.e., '1' after a program pulse is N times provided. However, in case of a single level cell having slow program speed, every data stored in the latch is changed into a high level, i.e., '1' after the program pulse is (N+m) times provided.

In case of a normal memory cell, of multi level cells, to be programmed to a voltage more than a first verifying voltage PV1, every data stored in the latch is changed into a high level, i.e., '1' after a program pulse is N1 times provided. However, in case of a memory cell having slow program speed of the multi level cells, every data stored in the latch is changed into a high level, i.e., '1' after the program pulse is (N1+m1) times provided.

In case of a normal memory cell of multi level cells to be programmed to a voltage more than a second verifying voltage PV2, every data stored in the latch is changed into a high level, i.e., '1' after a program pulse is N2 times provided. However, in case of a memory cell having slow program speed of the multi level cells, every data stored in the latch is changed into a high level, i.e., '1' after the program pulse is (N2+m2) times provided.

In case of a normal memory cell of multi level cells to be programmed to a voltage more than a third verifying voltage PV3, every data stored in the latch is changed into a high level, i.e., '1' after a program pulse is N3 times provided. However, in case of a memory cell having slow program speed of the multi level cells, every data stored in the latch is changed into a high level, i.e., '1' after the program pulse is (N3+m3) times provided.

In a method of the present invention, the program pulse is not provided until every memory cell having slow program speed is programmed. However, according to an embodiment of the present invention, the memory cell having slow program speed may be programmed at given time point. That is, the method changes compulsorily the data stored in the latch of the page buffer.

FIG. 5 is a view illustrating a table showing change of data in a page buffer in accordance with program speed when a verifying operation is performed in a non-volatile memory device according to one example embodiment of the present invention.

In case that a single level cell, not programmed after a program pulse is N times provided, exists, data stored in a page buffer for a certain memory cell is compulsorily changed at a given time point. That is, the data having a low level stored in the first node QA is changed into a high level at the time point.

In case that a multi level cell having slow program speed exists though a verifying operation is performed on the basis of a corresponding verifying voltage, data stored in the page buffer for a certain memory cell is compulsorily changed at a given time point. In other words, the data having a low level stored in the first node QA is changed into a high level.

Hereinafter, the given time point and data setting method for the memory cell having slow program speed will be described in detail.

Figure 6:
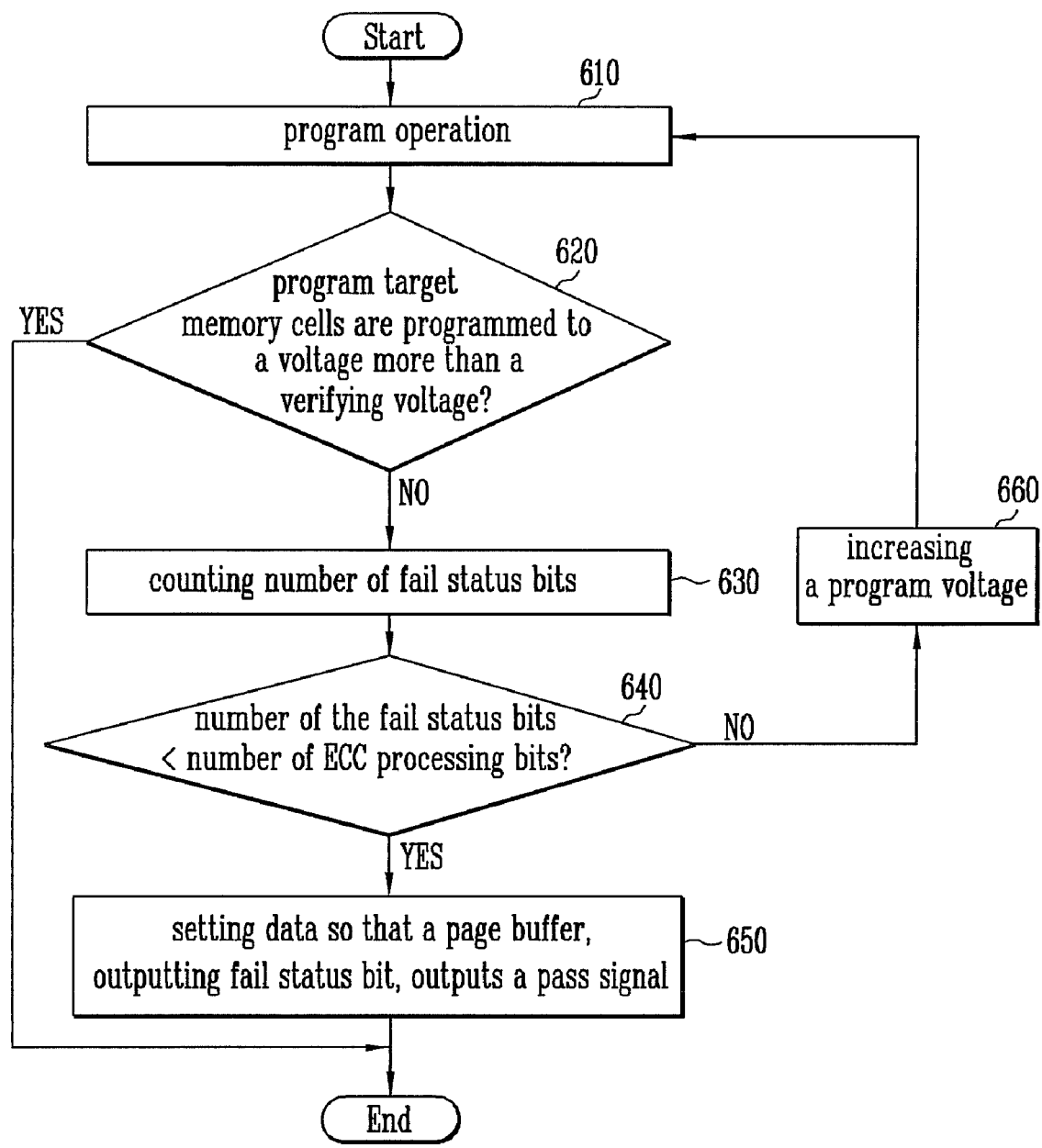
FIG. 6 is a flowchart illustrating a verifying operation in a non-volatile memory device according to one example embodiment of the present invention.

FIG. 6 is a flowchart illustrating a verifying operation in a non-volatile memory device according to one example embodiment of the present invention.

In step of S610, a program operation is performed. Particularly, a program pulse is provided to a page buffer having a program target memory cell in accordance with an ISPP method. As a result, threshold voltages of program target memory cells are increased in accordance with the program operation.

In step of S620, it is verified whether or not the program target memory cells are programmed to a voltage more than the verifying voltage. Here, the verifying process is performed through the data stored in the latch of the page buffer as described above. For example, it is verified that programming of the memory cell is completed in case that data having a high level is stored in the first node QA of every page buffer.

In case that it is verified that programming of the memory cell is completed, the program operation is finished.

However, in step of S630, in case that a memory cell, not programmed to a voltage more than the verifying voltage, of the program target memory cells exists, the number of the memory cells, i.e. the number of fail status bit is counted.

In case of the fail status bit, data having a different level from the programmed memory cell is stored in the first node QA. Accordingly, the number of the fail status bits may be counted on the basis of a level of the data outputted from each of the page buffers. This may be performed by a fail status bit counter or the like.

In step of S640, it is verified whether or not the number of the fail status bits is smaller than that of error collection code (ECC) processing bits of the non-volatile memory device.

A recent non-volatile memory device stores data using an ECC algorithm, and amends error data using the ECC algorithm in a read operation. Here, the ECC algorithm is executed by a controller. The method of the present embodiment may be applied to a non-volatile memory device only using the ECC algorithm. In this case, a process capability of the ECC algorithm is preset in accordance with a process capability of a processor included in the controller. For example, in case that the ECC algorithm for processing n-bit error is used, an error less than n bits may be amended through the ECC algorithm, but an error more than n bits may not be amended through the ECC algorithm. Namely, since an error may be amended through the ECC algorithm in case that the number of the fail status bit is less than that of the ECC processing bits, it is determined that a verifying operation for corresponding memory cell is completed.

Since an error is not amended through the ECC algorithm in case that the number of the fail status bits is more than that of the ECC processing bits, the program operation is repeatedly performed in the steps S640, 660 and 610. Here, the program voltage is increased by a step voltage, and then the program operation is again performed by using the increased program voltage.

However, since the error may be amended by using the ECC algorithm in case that the number of the fail status bits is smaller than that of the ECC processing bits, it is determined that the verifying operation is completed, and so data is set so that the page buffer outputting the fail status bit outputs a pass signal in steps of S640 and S650.

As described above, the data having a high level or a low level is stored in the first node QA of the latch included in each of the page buffers in accordance with the verifying operation.

In case of the memory cell programmed to a voltage more than the verifying voltage, the data having a high level may be stored in the first node QA. However, in case of the memory cell of which programming is not completed, the data having a low level is stored in the first node QA. That is, the data having a low level is stored in the first node QA of the page buffer which outputs the fail status bit. However, the method of the present invention stores data having a high level in the first node QA. Particularly, the method of the present invention pre-charges the sensing node SO coupled to whole page buffers to a high level, thereby driving the ground voltage supplying circuit 350. In addition, the method provides the first data setting signal READA_N, thereby storing data having a high level in the first node QA.

In short, in case that the step S650 is performed, the method enables regard that every memory cell is programmed to a voltage more than the verifying voltage, and is passed in accordance with data setting though every memory cell is not passed. Accordingly, no program operation is performed and the program operation is finished.

Figure 7:
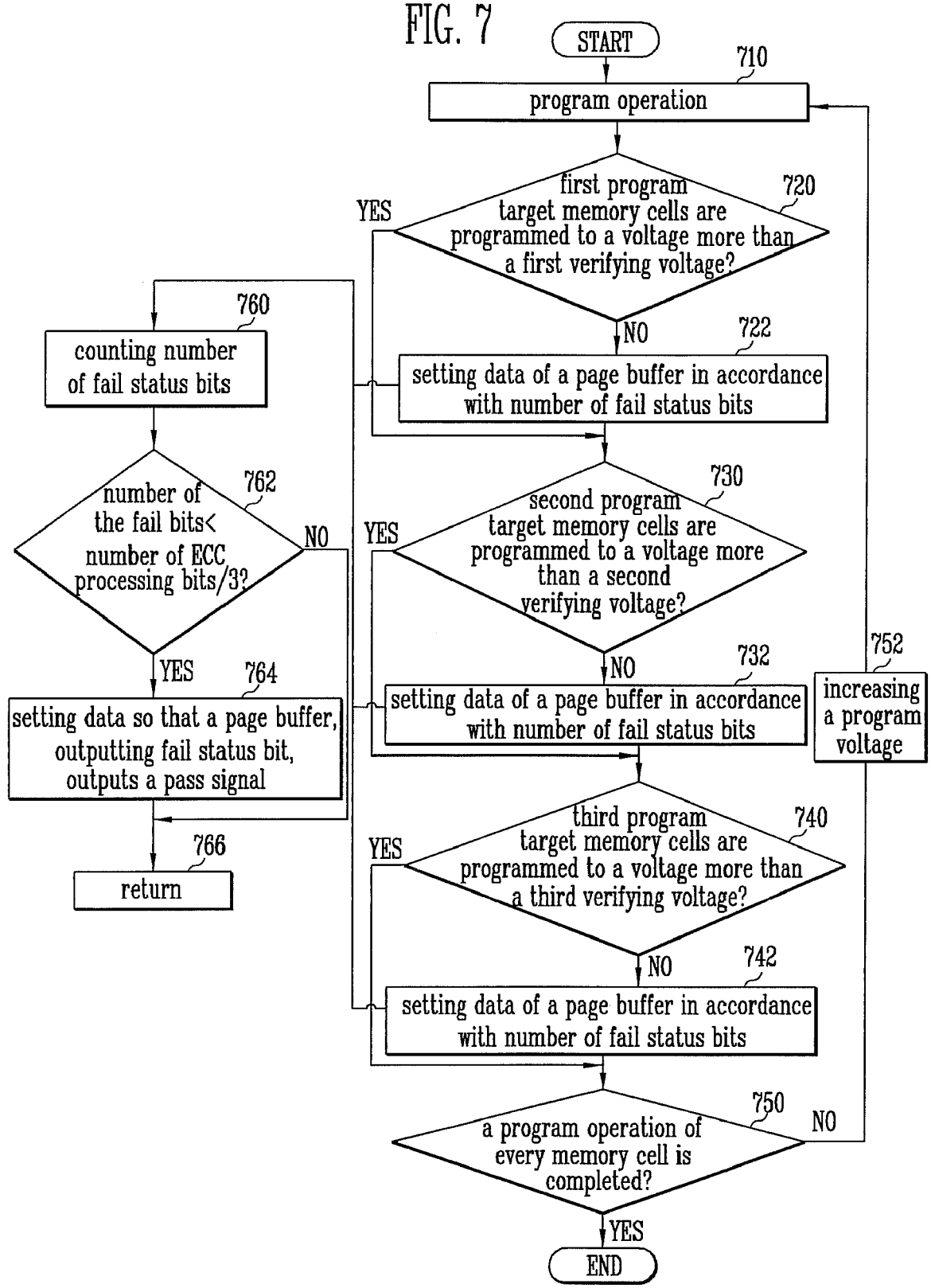
FIG. 7 is a flowchart illustrating a method of verifying a program operation in a non-volatile memory device according to another example embodiment of the present invention.

FIG. 7 is a flowchart illustrating a method of verifying a program operation in a non-volatile memory device according to another example embodiment of the present invention.

The method of the present embodiment may be applied for a program operation of a multi level cell having 2 bits.

A verifying operation is performed on the basis of three verifying voltages PV1, PV2 and PV3 when an MSB bit program operation of the program operation is performed.

In step of S710, a program operation is performed. Particularly, a program pulse is provided to a page buffer having a program target memory cell in accordance with an ISPP method. Threshold voltages of the program target memory cells are increased in accordance with the program operation.

In step of S720, it is verified whether or not first program target memory cells are programmed to a voltage more than the first verifying voltage PV1. Here, the first program target memory cells are memory cells to be programmed to a voltage between the first verifying voltage PV1 and the second verifying voltage PV2. This is verified through the data in the latch of the page buffer as described above.

For example, in case that data having a high level is stored in the first node QA of the page buffer for the first program target memory cells, it is determined that the program operation is completed. In this case, second program target memory cells and third program target memory cells are blocked so that a verifying operation for the second and third program target memory cells is not performed. Since this blocking method is well-known by a person skilled in an art, any further description concerning the blocking method will be omitted.

In step of S722, in case that first program target memory cells, programmed to a voltage smaller than the first verifying voltage PV1, exist, data setting operation of the page buffer is performed in accordance with the number of fail status bits. Here, the data setting operation is similar to that in FIG. 6.

In step of S760, the number of memory cells not programmed to the first verifying voltage PV1 of the first program target memory cells, i.e., the number of the fail status bits, is counted.

In case that the number of the fail status bits is smaller than a third of the number of the ECC processing bits in step S762, data is set so that the page buffer outputting the fail status bit outputs a pass signal in step S764. Detailed operation is similar to that in FIG. 6.

However, the number of the ECC processing bits is different from that in FIG. 6. In case that a method of programming a multi level cell having n bits is used, one of $2^n$ data is stored in one memory cell. In other words, $2^n$ different data may be stored in one page. With considering an erase target data about which a verifying operation is not needed, $2^{n-1}$ data may be stored in one page. In addition, a verifying operation is required for each data. In a process of programming a multi level cell having 2 bits, three verifying operations are needed.

Accordingly, to perform ECC processing for each verifying operations, ECC processing bits for the non-volatile memory device should be divided, and then divided bits should be used for each verifying operations. For example, in case that the number of the ECC processing bits to be processed by the controller of the non-volatile memory device is m, m errors may be amended when data stored in one page is processed. Hence, in a method, of programming a multi level cell, in which verifying operations are performed for each data, the ECC processing bits should be divided for each data. Here, since the verifying operation for the erase target data is not performed, corresponding ECC processing operation is not performed. Therefore, the number of the ECC processing bits is divided by $2^{n-1}$. In the method of programming the multi level cell having 2 bits, the number of the ECC processing bits is divided by 3, and then the number of the divided bits is compared with the number of the fail status bits.

On the other hand, since the second and third program target memory cells are blocked, the data setting operation is performed about only the page buffer for the first program target memory cells.

In step of S730, it is verified whether or not the second program target memory cells are programmed to a voltage more than the second verifying voltage PV2. Here, the second program target memory cells are memory cells to be programmed to a voltage between the second verifying voltage PV2 and the third verifying voltage PV3. This is verified through the data in the latch of the page buffer as described above.

For example, in case that data having a high level is stored in the first node QA of the page buffer for the second program target memory cells, it is determined that the program operation is completed. In this case, the first program target memory cells and the third program target memory cells are blocked so that a verifying operation for the first and third program target memory cells is not performed.

In step of S732, in case that second program target memory cells programmed to a voltage smaller than the second verifying voltage PV2 exist, data setting operation of the page buffer is performed in accordance with the number of fail status bit. Here, the data setting operation is similar to that mentioned above.

In the step S760, number of memory cells, not programmed to the second verifying voltage PV2, of the second program target memory cells, i.e., the number of the fail status bit, is counted.

In case that the number of the fail status bit is smaller than that of the ECC processing bits in step S762, data is set so that the page buffer outputting the fail status bit outputs a pass signal in step S764. However, since the first and third program target memory cells are blocked, the data setting operation is performed about only the page buffer for the second program target memory cells.

In step of S740, it is verified whether or not the third program target memory cells are programmed to a voltage more than the third verifying voltage PV3. Here, the third program target memory cells are memory cells to be programmed to a voltage more than the third verifying voltage PV3. This is verified through the data in the latch of the page buffer as described above.

For example, in case that data having a high level is stored in the first node QA of the page buffer for the third program target memory cells, it is determined that the program operation is completed. In this case, the first program target memory cells and the second program target memory cells are blocked so that a verifying operation for the first and second program target memory cells is not performed.

In step of S742, in case that third program target memory cells programmed to a voltage smaller than the third verifying voltage PV3 exist, data setting operation of the page buffer is performed in accordance with the number of fail status bits. Here, the data setting operation is similar to that mentioned above.

In the step S760, the number of memory cells, not programmed to the third verifying voltage PV3, of the third program target memory cells, i.e., the number of the fail status bits, is counted.

In case that the number of the fail status bits is smaller than that of the ECC processing bits in step S762, data is set so that the page buffer outputting the fail status bit outputs a pass signal in step S764. However, since the first and second program target memory cells are blocked, the data setting operation is performed about only the page buffer for the third program target memory cells.

In case that every memory cell is programmed to a voltage more than corresponding verifying voltage through the above process, the program operation is finished. However, in case that every memory cell is not programmed to a voltage more than corresponding verifying voltage, the program voltage is increased and then the program operation is repeatedly performed by using the increased program voltage in steps of S750, S752 and S710.

The methods in FIG. 6 and FIG. 7 compare the number of the fail status bits with the number of the ECC processing bits, and determine whether or not the verifying operation is continuously performed in accordance with the compared result.

Namely, in case that the number of the fail status bits included in one page is smaller than that of the ECC processing bits, the verifying operation is finished. Then, data setting of the page buffer is changed to be regarded the fail status bits as a pass state.

Since the memory cell corresponding to the fail status bit is programmed to a voltage less than the verifying voltage, the memory cell is read as a memory cell not programmed in a following read operation. However, since an error is amended through the ECC process algorithm, the memory cell corresponding to the fail status bit is read as a programmed memory cell in the read operation.

Hereinafter, a method of verifying a program operation in a non-volatile memory device according to still another example embodiment of the present invention will be described in detail.

In the method of the present embodiment, some of conventional memory cells are assumed as sample cells. In addition, the method determines whether or not a verifying voltage is further performed on the basis of a result as to completion of a verifying operation of the sample cells. Here, the sample cell is a cell having the same physical property as the conventional memory cell. The method will be described in detail with reference to accompanying drawing.

Figure 8:
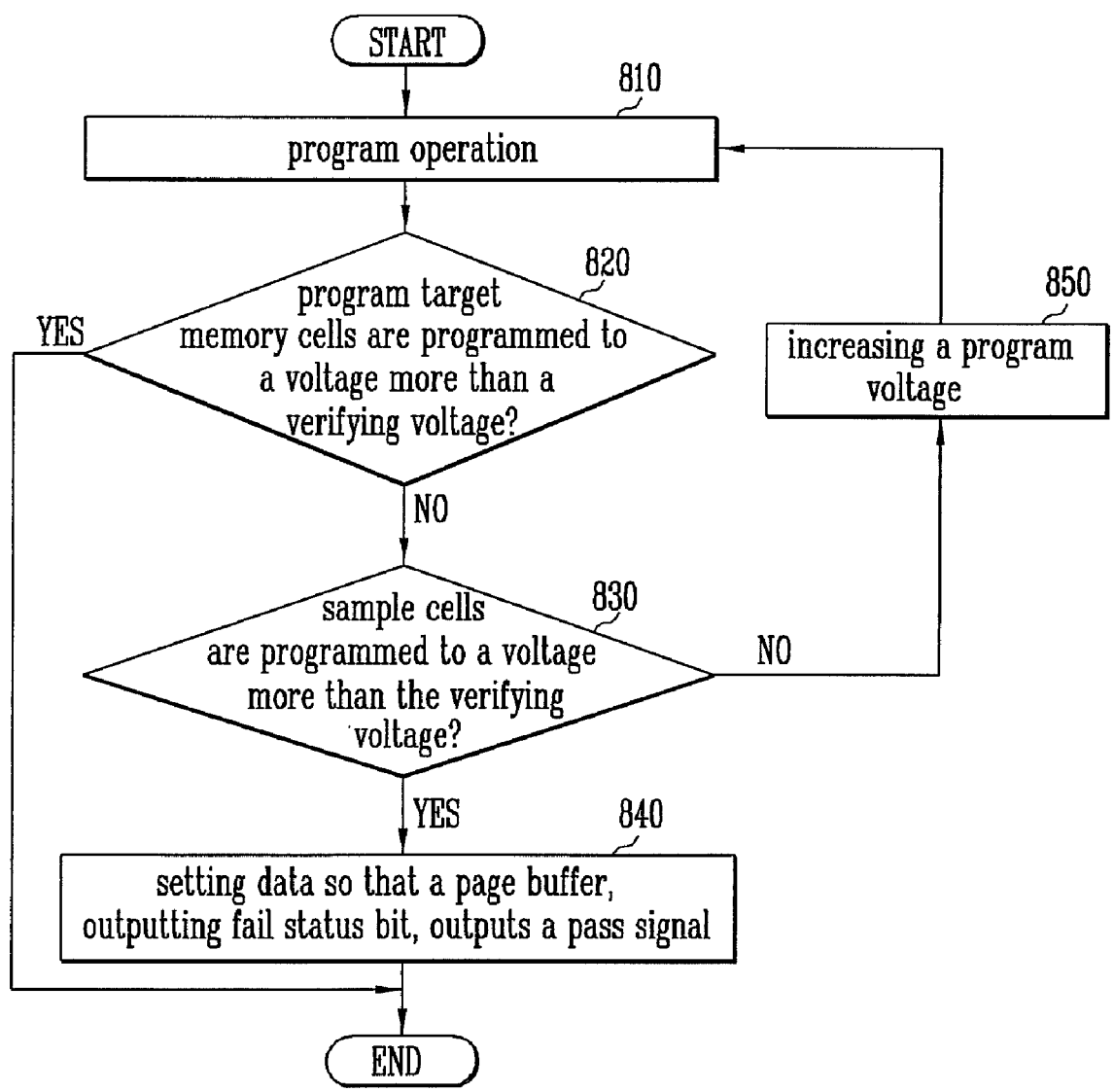
FIG. 8 is a flowchart illustrating a method of verifying a program operation in a non-volatile memory device according to still another example embodiment of the present invention.

FIG. 8 is a flowchart illustrating a method of verifying a program operation in a non-volatile memory device according to still another example embodiment of the present invention.

In step of S810, a program operation is performed. Particularly, a program pulse is provided to a page having a program target memory cell in accordance with an ISPP method. Threshold voltages of the program target memory cells are increased in accordance with the program operation.

In step of S820, it is verified whether or not the program target memory cells are programmed to a voltage more than a verifying voltage. This is verified through the data in the latch of the page buffer as described above. For example, in case that data having a high level is stored in the first node QA of whole page buffers, the method determines that the program operation is completed.

In case that it is verified that the program operation is completed, the program operation is finished.

In step of S830, in case that a memory cell, not programmed to a voltage more than the verifying voltage of the program target memory cells, exists, it is verified whether or not the sample cells are programmed to a voltage more than the verifying voltage. Here, the sample cells are memory cells for representing program characteristics of each page. It is desirable that the sample cells are set for each of pages. As a result, the sample cells are programmed and read with conventional memory cell of a page to be programmed.

The sample cells may be included in a spare cell programmed with a main memory cell. The number of the sample cells is set as optimal value considering characteristic of the memory cells. This setting process may be performed in accordance with reference in FIG. 6 and FIG. 7.

In the embodiments in FIG. 6 and FIG. 7, the data is set at a time point at which the number of the fail status bits of the memory cells is smaller than that of the ECC processing bits.

The number of the sample cells is set so that programming of the sample cells is completed at the time point at which number of the fail status bits is smaller than that of the ECC processing bits.

100 memory cells may be set as the sample cells, and the sample cells are read at the time point at which the number of the fail status bits of the memory cells is smaller than that of the ECC processing bits. Here, in case that the sample cell, which is not programmed, exists, the optimal value is set by reducing the number of the sample cells.

The method of the present invention determines completion of the program operation on the basis of data stored in a latch of a page buffer coupled to the sample cells. For example, in case that the data having a high level is stored in the first node QA of the page buffer coupled to the sample cells, it is determined that programming of the sample cells is completed.

In step of S840, in case that the sample cells are programmed to a voltage more than corresponding verifying voltage, additional program operation/verifying operation is not performed about a memory cell having a slow program speed, and data is set so that the page buffer for outputting the fail status bit outputs a pass signal. Data setting method using the page buffer is the same as the above data setting method.

In case that the step S840 is performed, the method enables regard that every memory cell is programmed to a voltage more than the verifying voltage. That is, data is set so that programming of the memory cells is passed. In this case, no program operation is performed, and the program operation is finished.

Figure 9:
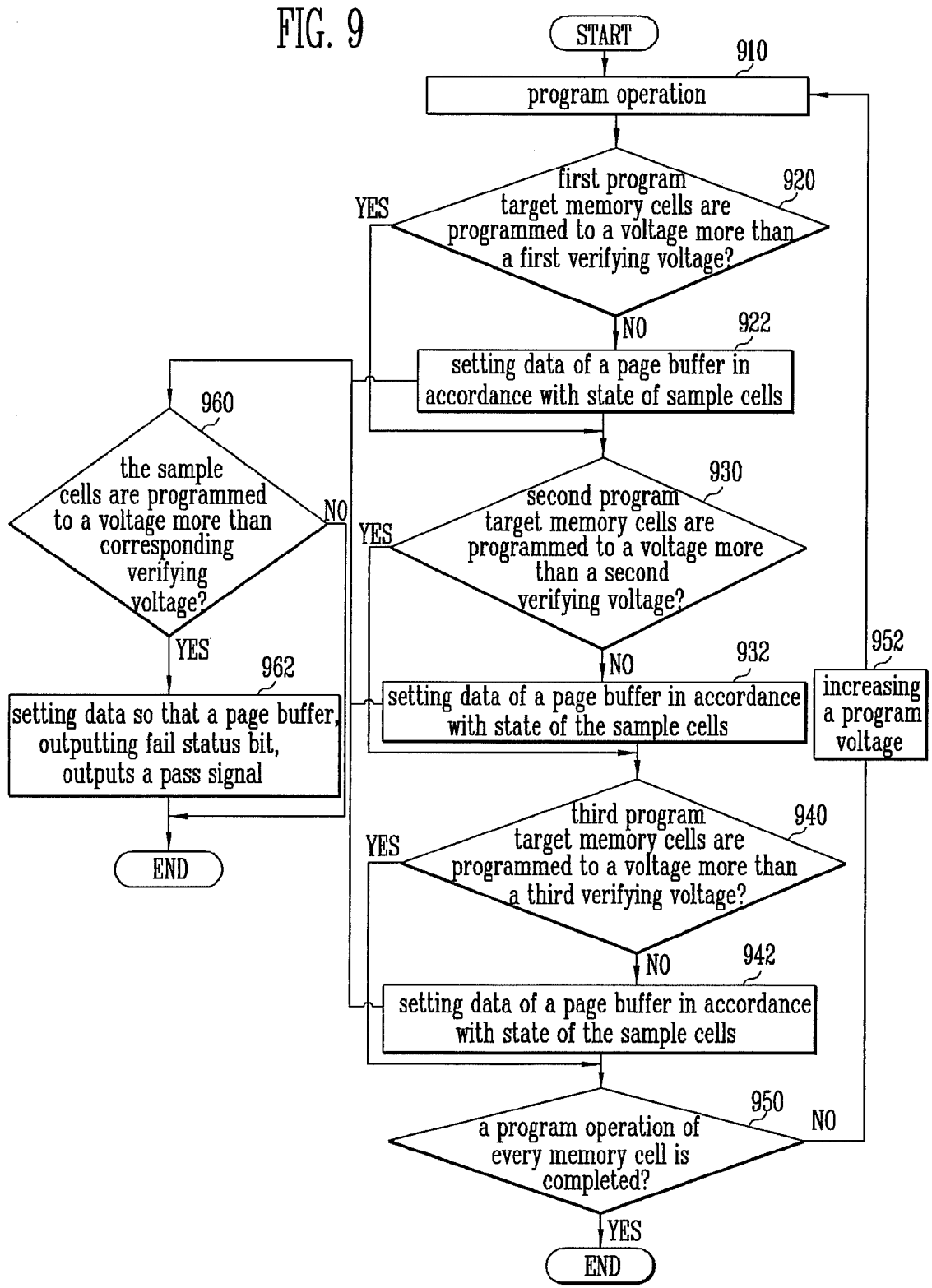
FIG. 9 is a flowchart illustrating a method of verifying a program operation in a non-volatile memory device according to still another example embodiment of the present invention.

FIG. 9 is a flowchart illustrating a method of verifying a program operation in a non-volatile memory device according to still another example embodiment of the present invention.

The above method may be applied for a program operation of a multi level cell having two bits.

In case that an MSB program operation of the program operation is performed, a verifying operation is performed on the basis of three verifying voltages PV1, PV2 and PV3.

In step of S910, the program operation is performed. Particularly, a program pulse is provided to a page having a program target memory cell in accordance with an ISPP method. Threshold voltages of the program target memory cells are increased in accordance with the program operation.

In step of S920, it is verified whether or not first program target memory cells are programmed to a voltage more than a first verifying voltage PV1. This is verified through the data in the latch of the page buffer as described above.

For example, in case that data having a high level is stored in the first node QA of the page buffer for the first program target memory cells, it is determined that the program operation is completed. In this case, second program target memory cells and third program target memory cells included in the same page are blocked so that a verifying operation for the second and third program target memory cells is not performed.

In step of S922, in case that first program target memory cells, programmed to a voltage smaller than the first verifying voltage PV1, exist, data setting operation of the page buffer in accordance with state of sample cells is performed. Here, the data setting operation is similar to that in FIG. 8. However, the sample cells are divided into the first program target memory cells, the second program target memory cells and the third program target memory cells unlike the method in FIG. 8. The first program target memory cells are memory cells to be programmed to the first verifying voltage PV1, the second program target memory cells are memory cells to be programmed to the second verifying voltage PV2, and the third program target memory cells are memory cells to be programmed to the third verifying voltage PV3.

In step of S962, in case that the program operation for the first program target memory cells is completed, data is set so that the page buffer for outputting the fail status bit outputs a pass signal. This data setting operation is similar to that in the method mentioned above.

On the other hand, since the second and third program target memory cells are blocked, the data setting operation is performed about only the page buffer for the first program target memory cells.

In step of S930, it is verified whether or not the second program target memory cells are programmed to a voltage more than the second verifying voltage PV2. Here, the second program target memory cells are memory cells to be programmed to a voltage between the second verifying voltage PV2 and the third verifying voltage PV3. This is verified through the data in the latch of the page buffer as described above.

For example, in case that data having a high level is stored in the first node QA of the page buffer for the second program target memory cells, it is determined that the program operation is completed. In this case, the first program target memory cells and the third program target memory cells are blocked so that a verifying operation for the first and third program target memory cells is not performed.

In step of S932, in case that second program target memory cells, programmed to a voltage smaller than the second verifying voltage PV2, exist, data setting operation of the page buffer in accordance with state of sample cells is performed. Here, the data setting operation is similar to that mentioned above.

In step of S962, in case that the program operation for the second program target memory cells is completed, data is set so that the page buffer for outputting the fail status bit outputs a pass signal. This data setting operation is similar to in the method mentioned above.

On the other hand, since the first and third program target memory cells are blocked, the data setting operation is performed about only the page buffer for the second program target memory cells.

In step of S940, it is verified whether or not the third program target memory cells are programmed to a voltage more than the third verifying voltage PV3. Here, the third program target memory cells are memory cells to be programmed to a voltage more than the third verifying voltage PV3. This is verified through the data in the latch of the page buffer as described above.

For example, in case that data having a high level is stored in the first node QA of the page buffer for the third program target memory cells, it is determined that the program operation is completed. In this case, the first program target memory cells and the second program target memory cells are blocked so that a verifying operation for the first and second program target memory cells is not performed.

In step of S942, in case that third program target memory cells, programmed to a voltage smaller than the third verifying voltage PV3, exist, data setting operation of the page buffer in accordance with state of sample cells is performed.

This data setting operation is similar to in the method mentioned above. That is, in case that the program operation for the third program target memory cells is completed, data is set so that the page buffer outputting the fail status bit outputs a pass signal.

This data setting operation is similar to in the method mentioned above.

On the other hand, since the first and second program target memory cells are blocked, the data setting operation is performed about only the page buffer for the third program target memory cells.

In case that every memory cell is programmed to a voltage more than corresponding verifying voltage, the program operation is finished.

However, in case that every memory cell is not programmed, the program voltage is increased, and then the program operation is repeatedly performed by using the increased program voltage in steps S950, S952 and S910.

The methods in FIG. 8 and FIG. 9 verify program state of the sample cells, and determine through the verified result whether or not additional verifying operation is performed.

Any reference in this specification to "one embodiment," "an embodiment," "example embodiment," and the like, means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those is skilled in the art.

What is claimed is:

1. A method of verifying a program operation in a non-volatile memory device, the method comprising:
    performing a program operation;
    verifying whether or not each of a plurality of first program target memory cells is programmed to a voltage higher than a first verifying voltage;
    setting data so that a page buffer for the first program target memory cells outputs a first pass signal in accordance with the number of fail status bits in response to determining that a fail status memory cell is not programmed to a voltage higher than the first verifying voltage;
    verifying whether or not each of a plurality of second program target memory cells is programmed to a voltage higher than a second verifying voltage;
    setting data so that a page buffer for the second program target memory cells outputs a second pass signal in accordance with the number of fail status bits in response to determining that a fail status memory cell is not programmed to a voltage higher than the second verifying voltage;
    verifying whether or not each of a plurality of third program target memory cells is programmed to a voltage higher than a third verifying voltage; and
    setting data so that a page buffer for the third program target memory cells outputs a third pass signal in accordance with the number of fail status bits in response to determining that a fail memory cell is not programmed to a voltage higher than the third verifying voltage.

2. The method of claim 1, further comprising:
    increasing a program voltage and performing repeatedly the program operation by using the increased program voltage until each of the first, second and third program target memory cells is programmed to a voltage higher than the corresponding verifying voltage.

3. The method of claim 1, wherein the step of setting the data includes:
    providing a ground voltage to a given node of a latch of each of the page buffers by precharging a sensing node of the page buffer to a high level.

4. The method of claim 1, wherein the step of setting the data so that the page buffer outputs the first pass signal includes:
    counting the number of the fail status bits; and
    setting the data so that the page buffer for the first program target memory cells outputs the first pass signal in response to the number of the fail status bits being smaller than a third of the number of ECC processing bits.

5. The method of claim 1, wherein the step of setting the data so that the page buffer outputs the second pass signal includes:
    counting the number of the fail status bits; and
    setting the data so that the page buffer for the second program target memory cells outputs the second pass signal in response to the number of the fail status bits being smaller than a third of the number of ECC processing bits.

6. The method of claim 1, wherein the step of setting the data so that the page buffer outputs the third pass signal includes:
counting the number of the fail status bits; and
setting the data so that the page buffer for the third program target memory cells outputs the third pass signal in response to the number of the fail status bits being smaller than a third of the number of ECC processing bits.

7. A method of verifying a program operation in a non-volatile memory device, the method comprising:
performing a program operation on memory cells and sample cells;
verifying whether or not each of a plurality of program target memory cells is programmed to a voltage higher than a verifying voltage;
verifying whether or not each of a plurality of sample cells is programmed to a voltage higher than the verifying voltage when there is a program target memory cell which is not programmed to a voltage higher than the verifying voltage; and
setting pass data to page buffers associated with the program target memory cells when each of a plurality of the sample cells is programmed to a voltage higher than the verifying voltage so that each of the page buffers outputs a pass signal.

8. The method of claim 7, further comprising:
increasing a program voltage in response to determining that each of the sample cells is programmed to a voltage smaller than the verifying voltage based on the verified result, and repeatedly performing the program operation by using the increased program voltage.

9. The method of claim 7, further comprising:
finishing the program operation in response to each of the program target memory cells is programmed to a voltage higher than the verifying voltage.

10. The method of claim 7, wherein the step of setting the pass data includes:
providing a ground voltage to a given node of a latch of each of the page buffers by precharging a sensing node of the page buffer to a high level.

11. A method of verifying a program operation in a non-volatile memory device, the method comprising:
performing a program operation on memory cells and sample cells;
verifying whether or not each of first program target memory cells is programmed to a voltage higher than a first verifying voltage;
setting data so that a page buffer for the first program target memory cells outputs a first pass signal in response to a fail status state of the sample cells in response to determining that a fail status cell is not programmed to a voltage higher than the first verifying voltage based on the verified result;
verifying whether or not each of a plurality of second program target memory cells is programmed to a voltage higher than a second verifying voltage;
setting data so that a page buffer for the second program target memory cells outputs a second pass signal based on a fail status of the sample cells in response to determining that a fail status cell is not programmed to a voltage higher than the second verifying voltage based on the verified result;
verifying whether or not each of a plurality of third program target memory cells is programmed to a voltage higher than a third verifying voltage; and
setting data so that a page buffer for the third program target memory cells outputs a third pass signal in response to a fail status of the sample cells in response to determining that a fail status cell is not programmed to a voltage higher than the third verifying voltage based on the verified result.

12. The method of claim 11, further comprising:
increasing a program voltage and performing repeatedly the program operation by using the increased program voltage until each of the first, second and third program target memory cells is programmed to a voltage higher than the corresponding verifying voltage.

13. The method of claim 11, wherein the step of setting the data for each of the page buffers for the first, and second and third program target memory cells includes:
providing a ground voltage to a given node of a latch in the page buffers by precharging a sensing node of the page buffer to a high level.

14. The method of claim 11, wherein the step of setting the data so that the page buffer outputs the first pass signal includes:
verifying whether or not each of the first program target memory cells included in the sample cells is programmed to a voltage higher than the first verifying voltage; and
setting the data so that the page buffer for the first program target memory cells outputs the first pass signal in response to determining that each of the first program target memory cell is programmed to a voltage higher than the first verifying voltage based on the verified result.

15. The method of claim 11, wherein the step of setting the data so that the page buffer outputs the second pass signal includes:
verifying whether or not the each of the second program target memory cells in the sample cells is programmed to a voltage higher than the second verifying voltage; and
setting the data so that the page buffer for the second program target memory cells outputs the second pass signal in response to determining that each of the second program target memory cell is programmed to a voltage higher than the second verifying voltage based on the verified result.

16. The method of claim 11, wherein the step of setting the data so that the page buffer outputs the third pass signal includes:
verifying whether or not each of the third program target memory cells included in the sample cells is programmed to a voltage higher than the third verifying voltage; and
setting the data so that the page buffer for the third program target memory cells outputs the third pass signal in response to determining that each of third program target memory cells is programmed to a voltage higher than the third verifying voltage based on the verified result.

* * * * *